United States Patent
Kikuchi et al.

(10) Patent No.: US 8,039,756 B2
(45) Date of Patent: Oct. 18, 2011

(54) MULTILAYERED WIRING BOARD, SEMICONDUCTOR DEVICE IN WHICH MULTILAYERED WIRING BOARD IS USED, AND METHOD FOR MANUFACTURING THE SAME

(75) Inventors: Katsumi Kikuchi, Tokyo (JP); Shintaro Yamamichi, Tokyo (JP); Yoichiro Kurita, Kanagawa (JP); Koji Soejima, Kanagawa (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 266 days.

(21) Appl. No.: 11/542,309

(22) Filed: Oct. 4, 2006

(65) Prior Publication Data
US 2007/0079986 A1    Apr. 12, 2007

(30) Foreign Application Priority Data
Oct. 12, 2005  (JP) ................................. 2005-298159

(51) Int. Cl.
  *H05K 1/16*  (2006.01)
(52) U.S. Cl. ........ 174/260; 174/255; 361/763; 257/737
(58) Field of Classification Search .................. 174/260, 174/255; 361/763; 257/737, 738
See application file for complete search history.

(56) References Cited

U.S. PATENT DOCUMENTS

| | | | |
|---|---|---|---|
| 6,351,031 B1* | 2/2002 | Iijima et al. | 257/698 |
| 6,441,314 B2* | 8/2002 | Rokugawa et al. | 174/255 |
| 6,707,685 B2* | 3/2004 | Kabumoto et al. | 361/794 |
| 6,724,638 B1* | 4/2004 | Inagaki et al. | 361/763 |
| 6,847,527 B2* | 1/2005 | Sylvester et al. | 361/763 |
| 7,071,569 B2* | 7/2006 | Ho et al. | 257/778 |
| 7,115,818 B2* | 10/2006 | Kusano et al. | 174/254 |
| 7,161,088 B2* | 1/2007 | Nicolaisen | 174/256 |
| 7,224,046 B2* | 5/2007 | Abe et al. | 257/668 |
| 7,656,677 B2* | 2/2010 | Ogawa et al. | 361/760 |
| 2002/0043399 A1* | 4/2002 | Sasaki et al. | 174/260 |
| 2005/0088833 A1* | 4/2005 | Kikuchi et al. | 361/763 |
| 2005/0218503 A1 | 10/2005 | Abe et al. | |

FOREIGN PATENT DOCUMENTS

| | | |
|---|---|---|
| JP | 05-259639 A | 10/1993 |
| JP | 9-186509 A | 7/1997 |
| JP | 2000-196243 A | 7/2000 |
| JP | 2000-323613 A | 11/2000 |
| JP | 2003-309121 A | 10/2003 |
| JP | 2004-200668 A | 7/2004 |

* cited by examiner

*Primary Examiner* — Yuriy Semenenko
*Assistant Examiner* — Andargie M Aychillhum
(74) *Attorney, Agent, or Firm* — Sughrue Mion, PLLC

(57) ABSTRACT

A multilayered wiring board has electrodes disposed on a first surface and a second surface, alternately layered insulation layers and wiring layers, and vias that are disposed in the insulation layer and electrically connect the wiring layers. The second electrode disposed on the second surface is embedded in the insulation layer exposed on said second surface, and the second wiring layer covered by the insulation layer exposed on said second surface does not have a layer for improving adhesion to the insulation layer.

15 Claims, 5 Drawing Sheets

MULTILAYERED WIRING BOARD, SEMICONDUCTOR DEVICE IN WHICH MULTILAYERED WIRING BOARD IS USED, AND METHOD FOR MANUFACTURING THE SAME

BACKGROUND OF THE INVENTION

1. Field of the Invention

The present invention relates to a wiring board on which a semiconductor element is mounted, a semiconductor device in which a semiconductor element is mounted on the wiring board, and a method for manufacturing the same, and more particularly relates to a thin multilayered wiring board having excellent high-speed transmission characteristics and to a semiconductor device that uses the wiring board.

2. Description of the Related Art

Electronic devices are rapidly becoming smaller, thinner, and increasingly dense, as recently seen in mobile equipment, and greater thinness, lighter weight, higher density, and other characteristics are needed in wiring boards used in device and semiconductor element mounting due to the increase in the number of terminals that is associated with higher speeds and functionality of semiconductor elements.

Built-up boards and other boards having through-holes have conventionally been commonly used as wiring boards, but boards having through-holes are thick and are furthermore not suited to high-speed signal transmission due to the presence of through-holes.

Tape boards and other thin boards, on the other hand, are also used, but such boards cannot meet the recent demand for higher density because the methods for manufacturing tape boards limit the wiring layers to one or two layers, and the pattern positioning accuracy is inferior to built-up boards due to considerable shrinkage of the tape material.

Coreless boards have been proposed as a method for improving the problems of these wiring boards. In these boards, a wiring structure body or the like is formed on a support board that has been prepared in advance, the support board is removed or separated after the wiring structure body has been formed, and through-holes are left unformed.

The thickness of the insulating resin needs to be reduced to about 10 μm per layer in order to match the impedance of the electric circuit due to increasingly smaller wiring, and the insulating resin must have sufficient mechanical strength to be able to be thin and still be used for multilayered wiring boards. In response to these needs, a polyimide-based material, or a PBO-based (polybenzoxazole-based) material must be selected for resins having good mechanical strength and thinness as a material for the insulating resin.

Also, from the aspect of electrical characteristics and wiring design, vias with a diameter of about 10 μm are required together with the smaller wiring. Photolithography must be used in order to form vias having a diameter of about 10 μm because of the difficulty of obtaining a required shape when laser-machining or dry-etching an insulating resin.

For this reason, an insulating resin that can meet these needs requires the use of a photosensitive polyimide-based material or a PBO-based material.

Disclosed in Japanese Laid-open Patent Application No. 2000-323613 (prior art 1) is a technique in which a copper plate is used as a support board, a wiring structure is formed on the plate, and the support board is then etched away to obtain a coreless board.

Disclosed in Japanese Laid-open Patent Application No. 05-259639 (prior art 2) is a technique in which a stainless steel plate is used as a support board, a wiring structure is formed on the plate, and the support board is then peeled away to obtain a coreless board.

Disclosed in Japanese Laid-open Patent Application No. 2004-200668 (prior art 3) is a technique in which a copper foil is used as a support board, a wiring structure is formed on the foil and semiconductor elements are mounted, and the copper foil is etched to obtain a coreless board. Also disclosed in the publication is a semiconductor device in which the coreless board is used.

Disclosed in Japanese Laid-open Patent Application No. 2000-196243 (prior art 4) is a technique in which a glass board is used as a support board, a wiring structure is formed on the board, the insulation layer is abraded by laser light that is passed through the glass board, and the support board 30 is separated by exposure to pressurized steam to obtain a coreless board.

Nevertheless, the above-described methods for manufacturing the wiring boards and semiconductor devices in which a release layer is used have the following problems.

All of the prior arts 1 to 4 have structures that provided high expectations for improvements in transmission characteristics by obtaining coreless boards devoid of vias that lengthen the transmission distance, and prior arts 1 to 3 provide the necessary physical adhesive strength by roughening the surface of the insulating resin or conductor in order to ensure adhesion of the conductor on the insulating resin or the insulating resin on the conductor. Also adopted is a method for using an adhesive layer composed of chromium, titanium, tungsten, molybdenum, tantalum, vanadium, nickel, or the like in order to assure adhesive strength on the insulating resin without roughening the surface.

However, it is known that the resistance value and shape of a wiring surface have a considerable effect on the transmission characteristics as the speeds and frequencies of the semiconductor element (skin effect) become higher. For this reason, the transmission characteristics are degraded by the roughening of the surface of the insulating resin and conductor and the use of an adhesive layer composed of chromium, titanium, tungsten, molybdenum, tantalum, vanadium, nickel, or another material that has a much higher specific resistance than copper.

A photosensitive polyimide-base material and PBO material that allow vias having a diameter of about 10 μm to be formed must have a shape in which the via walls stand vertically erect because of the high resolution. Positive materials that use diazonaphthoquinone (DNQ) as a photosensitizer are excellent from the aspect of via resolution for meeting the demand for these micro-vias. However, the diazonaphthoquinone-based (DNQ-based) materials have a problem in that these materials considerably reduce the adhesion of the boundary between the insulating resin and chromium, titanium, tungsten, molybdenum, tantalum, vanadium, nickel, and other materials used in the adhesive layer and that the conductive pattern peels away because decomposition products, reaction products, and other products of the material itself are produced during heating.

In prior art 4, there is no disclosure in relation to using an adhesive layer on the wiring and roughening the surface of the insulating resin and conductor. However, since only a method for manufacturing by using CMP (Chemical Mechanical Polishing) is disclosed, it is believed that the use of a non-photosensitive resin is assumed. In particular, there is no disclosure regarding the characteristics of a photosensitive polyimide-based material in which a diazonaphthoquinone-based (DNQ-based) material is used as a photosensitizer, which is the subject matter of the present invention.

SUMMARY OF THE INVENTION

An object of the present invention is to provide a low-cost multilayered wiring board that has excellent high-speed, high-frequency characteristics, to provide a semiconductor device in which the multilayered wiring board is used, and to provide a method for manufacturing the same, by using an insulating resin composed of a photosensitive polyimide-based resin and PBO-based resin in which a diazonaphthoquinone-based (DNQ-based) material is used as a photosensitizer, and by avoiding the use of an adhesive layer composed of chromium, titanium, tungsten, molybdenum, tantalum, vanadium, nickel, or another material that reduces adhesion to the insulating resin and increases the resistance of the wiring layer covered by an insulation layer in which the wiring layout distance is increased.

The multilayered wiring board according to the present invention comprises electrodes disposed on a first surface and a second surface; alternately layered insulation layers and wiring layers; and vias that are disposed in the insulation layer and electrically connect the wiring layers, wherein the second electrode disposed on the second surface is embedded in the insulation layer, and the second wiring layer covered by the insulation layer does not have an layer that is adhesive to the insulation layer.

In the multilayered wiring board, the material of the adhesive layer is a metal whose main component is selected from chromium, titanium, tungsten, molybdenum, tantalum, vanadium, nickel, or the like, an alloy of two or more the metals, or a compound containing one or more of the metals.

In the multilayered wiring board, the material of the insulation layer is a photosensitive resin in which diazonaphthoquinone is used as a photosensitizer, for example.

The semiconductor device of the present invention comprises one or a plurality of semiconductor elements mounted on one or both of the first electrode and the second electrode of the above-described multilayered wiring board.

The method for manufacturing a multilayered wiring board of the present invention comprises forming an insulation layer and a second electrode on a support board; alternately laminating a second wiring layer and insulation layer on the second electrode and the insulation layer; forming a first electrode and an adhesive layer on the surface of the insulation layer on the side opposite the surface in contact with a support board; and removing the support board.

The method for manufacturing a semiconductor device of the present invention comprises forming an insulation layer 11 and a second electrode on a support board; alternately laminating a second wiring layer and insulation layer on the second electrode and the insulation layer; forming a first electrode and an adhesive layer on the surface of the insulation layer on the side opposite the surface in contact with a support board; mounting one or a plurality of semiconductor elements on the first electrode; and removing the support board.

In the methods for manufacturing a semiconductor device, a step may be provided for mounting one or a plurality of semiconductor elements on the second electrode after the step for removing the support board.

In accordance with the present invention, conductor peeling during heating can be effectively prevented in a multilayered wiring board that uses a photosensitive polyimide material in which a diazonaphthoquinone-based (DNQ-based) material is used as a photosensitizer. Also, signal degradation during transmission can be minimized, and a multilayered wiring board having high-speed, high-frequency characteristics can be obtained without the use of a high-resistance adhesive layer as the wiring layer, which has a long wiring distance and is covered by the insulation layer.

In accordance with the method for manufacturing the wiring board of the present invention, the wiring board of the present invention can be efficiently fabricated, stable wire formation is made possible by using a support board in the steps, and future high-density and micro-wire formation can be achieved. Since the thickness of the wiring board can furthermore be minimized by removing the support board after wiring formation, inductance can be reduced and electrical loss can be suppressed.

In accordance with the method for manufacturing the semiconductor device according to the present invention, the semiconductor device according to the present invention can be effectively fabricated, and since the semiconductor elements are mounted while making use of the stable support board, connections can be stably made at a very narrow pitch of 50 μm or less. The thickness of the wiring board can furthermore be minimized by removing the support board after the semiconductor elements have been mounted, and the space between previously mounted semiconductor elements can be set to a very short distance by mounting another semiconductor element on the exposed surface. For this reason, a large number of micro-connections can be provided, and high-speed signal transmission and a wide bus width can be brought about between the semiconductor elements on the two surfaces.

Also, the support board can be reused and the costs reduced by peeling away the support board in the removal step.

DESCRIPTION OF THE PREFERRED EMBODIMENTS

Embodiments of the present invention are described in detail below with reference to the attached diagrams.
(Multilayered Wiring Board)

Figure 1:
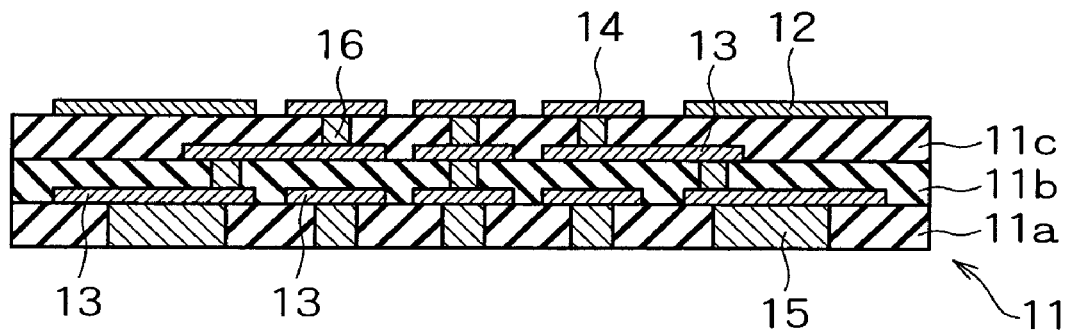
FIG. 1 is a local sectional view showing a multilayered wiring board according to the first embodiment of the present invention.

FIG. 1 is a local sectional view showing the multilayered wiring board according to the first embodiment of the present invention. The multilayered wiring board shown in FIG. 1 has second electrodes 15 embedded in the bottommost insulation layer 11a. A second wiring layer 13 is formed on the insulation layer 11a and second electrodes 15, and an intermediate insulation layer 11b is formed so as to cover the insulation layer 11a and second electrodes 15, including the second wiring layer 13. Also, one or a plurality of pairs of the second wiring layer 13 and intermediate insulation layer 11b is disposed (a single pair in the diagram). The second wiring layer 13 is formed on the topmost (a single layer in the diagram) intermediate insulation layer 11b, and a topmost insulation layer 11c is formed so as to cover the intermediate insulation layer 11b, including the second wiring layer 13. First electrodes 14 and a first wiring layer 12 are formed on the topmost insulation layer 11c. Vias 16 provide electrical connections between the first electrodes 14 and wiring layer 12 and the second wiring layer 13, and between the vertically-positioned second wiring layers 13. The second electrodes 15 embedded in the insulation layer 11a are in direct contact with, and are electrically connected to, the second wiring layer 13.

The insulation layers 11 (11a, 11b, and 11c) are formed from a photosensitive organic material in which, e.g., diazonaphthoquinone (DNQ), which has high via resolution, is used as a photosensitizer. Examples of the organic material that may be used include materials based on epoxy, epoxy acrylate, urethane acrylate, polyester, phenol, polyimide, BCB (benzocyclobutene), PBO (polybenzoxazole), polynorbornene, and the like. Polyimide-based materials and PBO-based materials have particularly good membrane strength, tensile modulus of elasticity, elongation at break, and other mechanical characteristics, and high reliability can therefore be achieved. Making the surface of the insulation layers 11 smooth without roughening the surface is advantageous for achieving excellent transmission characteristics. In the present invention, photosensitive polyimide is formed to a thickness of 10 μm, and the surface is not roughened.

A conductor that contains copper, gold, nickel, aluminum, silver, palladium, or a plurality of these components is preferably used as the principal component of the first wiring layer 12, but copper is most advantageous from the aspect of cost and resistance. Also, nickel can prevent an interface reaction with the insulation material or another material, and can be used as resistance wiring or as an inductor in which the magnetic characteristics are utilized.

The first wiring layer 12 is formed from copper, as described above, and the thickness is 10 μm, for example. Examples of the method for forming the first wiring layer 12 include the subtractive, semi-additive, and fully additive methods. The subtractive method is a method in which a resist of a desired pattern is formed on a copper foil disposed on a board, the unneeded copper foil is etched away, and the resist is thereafter peeled away to obtain the desired pattern. The semi-additive method is a method in which a power supply layer is formed by electroless plating, sputtering, CVD (Chemical Vapor Deposition), or another method; a resist having a desired pattern is then formed; a metal is deposited by electrolytic plating in the resist openings; the resist is removed; and the power supply layer is then etched to obtain the desired wiring pattern. The fully additive method is a method in which an electroless plating catalyst is adsorbed onto a board, a resist pattern is then formed, the catalyst is activated while the resist is left behind as an insulation layer, and a metal is deposited in the openings in the insulating film by electroless plating to obtain a desired wiring pattern. Also, a method may be used in which concavities that form the wiring pattern are formed in the insulation layer (not shown) on which the first wiring layer 12 is disposed; a power supply layer is formed by electroless plating, sputtering, CVD, or another method; the concavities are then filled using electroless plating or electrolytic plating; and the surface is smoothed by polishing.

A conductor that contains copper, gold, nickel, aluminum, silver, palladium, or a plurality of these components is also preferably used as the principal component of the second wiring layer 13, but copper is most advantageous from the aspect of cost and resistance. Because the second wiring layer 13 is a wiring layer that has a long wiring distance and affects the transmission characteristics, the second wiring layer 13 does not have an adhesive layer based on a material that improves adhesion to the insulation layer 11 and is typified by chromium, titanium, tungsten, molybdenum, tantalum, vanadium, nickel, or another material that has a higher resistance than the metal constituting the wiring.

When a conductor having nickel as its main component is used as the second wiring layer 13, wiring is used that is composed of a metal film having, e.g., a plurality of layers of copper and nickel layered on the insulation layer 11. A photosensitive organic material in which a diazonaphthoquinone-based (DNQ-based) material is used as a photosensitizer in the insulation layer 11 produces a large amount of products that result from decomposition, reaction, and other processes involving the diazonaphthoquinone-based (DNQ-based) material itself during heating. Therefore, the conductor pattern peels away because the adhesive strength of at the boundary between the insulation layer 11 and chromium, titanium, tungsten, molybdenum, tantalum, vanadium, nickel, or other material used in the adhesive layer is considerably reduced (a peel strength of about 0 N/m). For this reason, the second wiring layer 13 is optimally formed without the use of an adhesive layer material. Since an adhesive layer is not used, the resulting adhesion depends on the material of the insulation layer 11, and a weak adhesive strength of about 100 N/m in terms of peel strength may be imparted to the second wiring layer 13. A multilayered wiring board can still be stably obtained because adhesive strength is not considerably reduced, as is the case when an adhesive layer is used that is composed of chromium, titanium, tungsten, molybdenum, tantalum, vanadium, nickel, or the like.

Peeling and other defects furthermore do not occur because the second wiring layer 13 is covered by the insulation layer 11 and is not exposed. When adhesion is poor, measures that inhibit peeling can be added in conjunction with the insulation layer 11 material by narrowing the wiring width or using a reticulate shape in patterns with large surface areas. Since a material having a high resistance value is not present on the surface of the second wiring layer 13, a structure having excellent transmission characteristics is obtained. It is advantageous if the second wiring layer 13 is smooth and not roughened.

The second wiring layer 13 is formed from copper, as described above, and the thickness is 10 μm, for example. Examples of the method for forming the second wiring layer 13 include the subtractive, semi-additive, and fully additive methods. The subtractive method is a method in which a resist of a desired pattern is formed on a copper foil disposed on a board, the unneeded copper foil is etched away, and the resist is thereafter peeled away to obtain the desired pattern. The semi-additive method is a method in which a power supply layer is formed by electroless plating, sputtering, CVD, or another method; a resist having a desired pattern is then formed; a metal is deposited by electrolytic plating in the resist openings; the resist is removed; and the power supply layer is then etched to obtain the desired wiring pattern. The fully additive method is a method in which an electroless plating catalyst is adsorbed onto a board, a resist pattern is then formed, the catalyst is activated while the resist is left behind as an insulation layer, and a metal is deposited in the openings in the insulating film by electroless plating to obtain a desired wiring pattern. Also, a method may be used in which concavities that form the wiring pattern are formed in the insulation layer (not shown) on which the second wiring layer 13 is disposed; a power supply layer is formed by electroless plating, sputtering, CVD, or another method; the concavities are then filled using electroless plating or electrolytic plating; and the surface is smoothed by polishing.

First electrodes 14 are disposed on the surface of the insulation layer 11, and are electrically connected to the second electrodes 15 by way of the first wiring layer 12, second wiring layer 13, and vias 16. The first electrodes 14 can be formed by laminating a plurality of layers, for example, and the surface of the first electrodes 14 is preferably formed from at least one metal or an alloy selected from the group consisting of gold, silver, copper, tin, and solder materials, with consideration given to the connectivity of the bonding wire or the wettability of solder balls formed on the surface of the first electrodes 14 in a later step. Although not depicted, it is also possible to add a solder resist in a pattern having openings on the inner side of the first electrodes 14, or in a pattern having openings that do not make contact with the first electrodes 14. The structure may furthermore be one in which a solder resist pattern is formed and a first electrode 14 pattern is then disposed so as to cover the openings. The first wiring layer 12 and first electrodes 14 may be simultaneously formed in the same step. In the present embodiment, the topmost surface can be formed by sequentially layering copper to a thickness of 5 µm, nickel to a thickness of 3 µm, and gold to a thickness of 0.5 µm, wherein gold is the topmost layer.

Second electrodes 15 are disposed on the surface of the insulation layer 11, and are electrically connected to the first electrodes 14 by way of the first wiring layer 12, second wiring layer 13, and vias 16. The surface opposite from the surface of the second electrodes 15 that is connected to the second wiring layer 13 is exposed. The exposed surface of the second electrodes 15 may protrude from, be recessed from, or be substantially planar with the surface of the insulation layer 11 on which the first electrodes 14 are disposed. The second electrodes 15 can be formed by laminating a plurality of layers, for example, and the surface of the second electrodes 15 is preferably formed from at least one metal or an alloy selected from the group consisting of gold, silver, copper, tin, and solder materials, with consideration given to the connectivity of the bonding wire or the wettability of solder balls formed on the surface of the second electrodes 15, for example. In the present embodiment, the topmost surface can be formed by sequentially layering copper to a thickness of 5 µm, nickel to a thickness of 3 µm, and gold to a thickness of 0.5 µm, wherein gold is the topmost layer, for example.

In accordance with the present embodiment, signal degradation during transmission can be minimized, and a multilayered wiring board having high-speed, high-frequency characteristics can be obtained without the use of a high-resistance adhesive layer as the wiring layer, which has a long wiring distance and is covered by the insulation layer. A multilayered wiring board can furthermore be stably obtained without peeling due to considerably reduced adhesion of the conductor during heating, particularly when a photosensitive organic material is used in which diazonaphthoquinone (DNQ) is used as a photosensitizer, which has high via resolution.

In the embodiments described above, capacitors that serve as circuit noise filters may be disposed in desired locations on the wiring boards. The dielectric material constituting the capacitors is preferably titanium oxide, tantalum oxide, $Al_2O_3$, $SiO_2$, $ZrO_2$, $HfO_2$, $Nb_2O_5$, or another metal oxide; BST ($Ba_xSr_{1-x}TiO_3$), PZT ($PbZr_xTi_{1-x}O_3$), PLZT ($Pb_{1-y}La_yZr_xTi_{1-x}O_3$), or another perovskite material; or $SrBi_2Ta_2O_9$ or another Bi-based layered compound. The above compounds satisfy the conditions $0 \leq x \leq 1$ and $0 < y < 1$. Also, an organic material or the like in which an inorganic material or a magnetic material is added may be used as the dielectric material constituting the capacitors.

The capacitors serving as circuit noise filters may be disposed by constituting the layer or plurality of layers of the insulation layer 11 with a material that has a dielectric constant of 9 or higher, and by forming opposing electrodes in the desired positions of the first wiring layer 12, second wiring layer 13, first electrodes 14, and second electrodes 15 positioned above and below the insulation layer. The dielectric material constituting the capacitors is preferably $Al_2O_3$, $ZrO_2$, $HfO_2$, $Nb_2O_5$, or another metal oxide; BST ($Ba_xSr_{1-x}TiO_3$), PZT ($PbZr_xTi_{1-x}O_3$), PLZT ($Pb_{1-y}La_yZr_xTi_{1-x}O_3$), or another perovskite material; or $SrBi_2Ta_2O_9$ or another Bi-based layered compound. The above compounds satisfy the conditions $0 \leq x \leq 1$ and $0 < y < 1$. Also, an organic material or the like to which an inorganic material or a magnetic material is added may be used as the dielectric material constituting the capacitors.

(Semiconductor Device)

Figure 2:
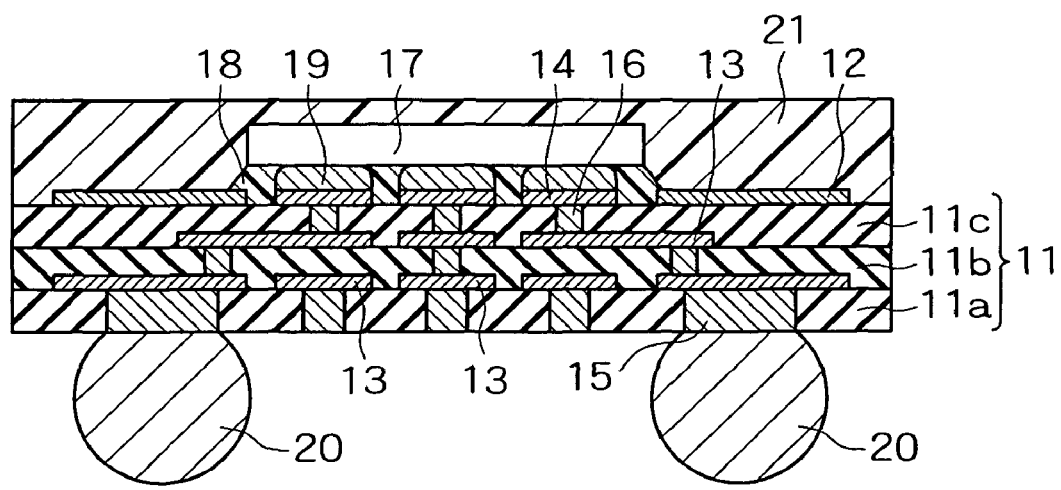
FIG. 2 is a local sectional view showing a semiconductor device according to the second embodiment of the present invention.

FIG. 2 is a cross-sectional view showing the semiconductor device according to the second embodiment of the present invention, and the wiring board shown FIG. 1 is used therein. In the FIG. 2, the second electrodes 15 disposed in the bottommost insulation layer 11a shown in FIG. 1 are shown as connected only to the solder balls 20. Accordingly, in FIG. 2, the same reference numerals are used for the same constituent elements as FIG. 1, and a detailed description of the multilayered wiring board shown in FIG. 1 is omitted.

The semiconductor device shown in FIG. 2 has a semiconductor element 17 mounted on the first electrodes 14 of the topmost insulation layer 11c of the multilayered wiring board shown in FIG. 1. The diagram shows only a single semiconductor element 17, but a plurality of semiconductor elements may be mounted, and capacitors, resistors, and other components may also be mounted.

The semiconductor element 17 is configured so that electrodes (not shown) on the surface of the semiconductor element 17 are electrically connected by way of the first electrodes 14 and solder balls 19, and an underfill resin 18 is filled into the space between the semiconductor element 17 and the multilayered wiring board. The underfill resin 18 is used for the purpose of reducing the difference in the coefficient of thermal expansion between the semiconductor element 17 and the multilayered wiring board, and preventing the solder balls 19 from breaking. An underfill resin 18 is not required to be filled as long as the solder ball 19 has sufficient strength to ensure the desired reliability. The solder balls 19 are microballs composed of solder material, and are formed by plating, ball transfer, or printing on the electrodes of the semiconductor element 17. The material of the solder balls 19 may be suitably selected from a lead-tin eutectic solder or a lead-free solder material. The underfill resin 18 is composed of an epoxy-based material and is filled after the semiconductor element 17 has been connected using the solder balls 19. A flip-chip connection was described in FIG. 2, but the semiconductor element 17 may be mounted by wire bonding.

The solder balls 20 are attached to the second electrodes 15 embedded in the bottommost insulation layer 11a so that the semiconductor device of the present invention can be mounted on another board. The solder balls 20 are balls composed of solder material, and can be formed by ball transfer or printing on the second electrodes 15. Depending on the mode of attachment, it is also possible to adopt a structure in which metal pins are soldered rather than the solder balls 20. A frame in which the area of the semiconductor element 17 is opened may be separately attached when the rigidity of the multilayered wiring board is insufficient in areas in which the semiconductor element 17 of the semiconductor device of the present embodiment is not mounted.

A sealing resin 21 comprising a material obtained by adding a silica filler to an epoxy-based material is applied using the printing method, compression molding, or transfer molding in which a metal mold is used, so as to cover the mounted semiconductor element 17 and the connecting portions of the element. The diagram in FIG. 2 shows a structure in which the sealing resin 21 covers the entire surface of one side of the wiring board, but the structure may also be one in which the semiconductor element 17 is partially covered to form a structure in which a part of the wiring board is exposed. Also, a sealing resin 21 is not required to be formed if there is no problem in the rigidity of the multilayered wiring board and in protecting the semiconductor element 17.

In accordance with the present embodiment, signal degradation during transmission can be minimized, and a multilayered wiring board having high-speed, high-frequency characteristics can be obtained without the use of a high-resistance adhesive layer as the wiring layer, which has a long wiring distance and is covered by the insulation layer. A semiconductor device can furthermore be stably obtained without peeling due to considerably reduced adhesion of the conductor during heating, particularly when a photosensitive organic material is used in which diazonaphthoquinone (DNQ) is used as a photosensitizer, which has high via resolution.

Figure 3:
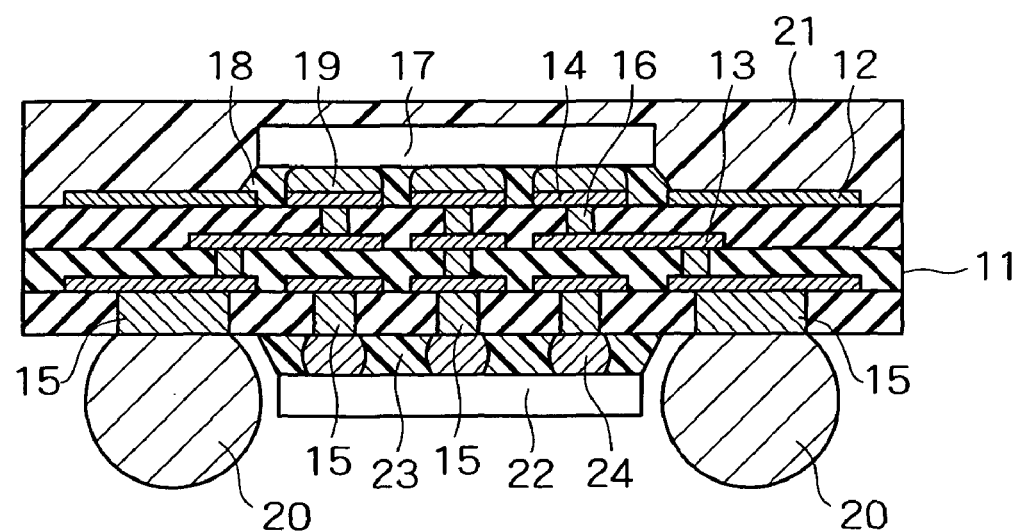
FIG. 3 is a local sectional view showing a semiconductor device according to the third embodiment of the present invention.

FIG. 3 is a cross-sectional view showing the semiconductor device according to the third embodiment of the present invention. This diagram is different from the second embodiment shown in FIG. 2 in that one or a plurality (a single device in the diagram) of semiconductor elements 22 are mounted on the lower surface of the bottommost insulation layer 11a of the multilayered wiring board. In FIG. 3, the same reference numerals are used for the same constituent elements, and a detailed description thereof is omitted. In the present embodiment, in addition to the second electrodes 15 to which the solder balls 20 are connected, a plurality of second electrodes 15 is formed on the bottommost insulation layer 11a of the multilayered wiring board, and a semiconductor element 22 is mounted on the second electrodes 15 by way of solder balls 24. A single semiconductor element 22 is shown in FIG. 3, but a plurality of semiconductor elements 22 may be mounted, and capacitors, resistors, and other components may also be mounted.

The semiconductor element 22 is configured so that electrodes (not shown) on the surface of the semiconductor element 22 are electrically connected by way of the second electrodes 15 and solder balls 24, and an underfill resin 23 is filled into the space between the semiconductor element 22 and the multilayered wiring board. The underfill resin 23 is used for the purpose of reducing the difference in the coefficient of thermal expansion between the semiconductor element 22 and the multilayered wiring board, and preventing the solder balls 24 from breaking. An underfill resin 23 is not required to be filled as long as the solder ball 24 has sufficient strength to ensure the desired reliability. The solder balls 24 are micro-balls composed of solder material, and are formed by plating, ball transfer, or printing on the electrodes of the semiconductor element 22. The material of the solder balls 24 may be suitably selected from a lead-tin eutectic solder or a lead-free solder material. The underfill resin 23 is composed of an epoxy-based material and is filled after the semiconductor element 22 has been connected using the solder balls 24.

Also, a flip-chip connection is shown in FIG. 3, but the semiconductor element 22 may be mounted using wire bonding.

In accordance with the present embodiment, signal degradation during transmission can be minimized, and a multilayered wiring board having high-speed, high-frequency characteristics can be obtained without the use of a high-resistance adhesive layer as the wiring layer, which has a long wiring distance and is covered by the insulation layer. A semiconductor device can furthermore be stably obtained without peeling due to considerably reduced adhesion of the conductor during heating, particularly when a photosensitive organic material is used in which diazonaphthoquinone (DNQ) is used as a photosensitizer, which has high via resolution. The distance between the semiconductor elements mounted on the two sides can be reduced and a high-performance, highly-functional semiconductor device can be achieved.

(Method for Manufacturing a Wiring Board)

Described next is the method for manufacturing a wiring board according to the fourth embodiment of the present invention. FIGS. 4A to 4F are local sectional views showing, as a sequence of steps, the method for manufacturing a multilayered wiring board according to the present embodiment. The manufacturing method of the present embodiment is used for manufacturing the wiring board of the first embodiment shown in FIG. 1. Washing and heating treatments are suitably carried out between each step.

Figure 4A:
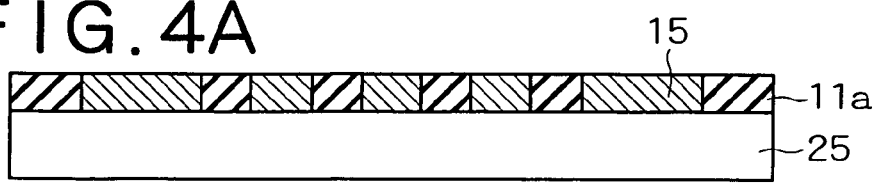
FIG. 4 is a local sectional view showing, as a sequence of steps, the method for manufacturing a multilayered wiring board according to the fourth embodiment of the present invention.

First, the second electrodes 15 and insulation layer 11a are formed on a support board 25, and the surface of the second electrodes 15 is exposed, as shown in FIG. 4A. The method of forming second electrodes 15 and an insulation layer 11a entails preparing a support board 25 and treating the surface by wet washing, dry washing, smoothing, roughening, or performing other treatments as required. The support board 25 is an electroconductive material or a material covered with an electroconductive film on the surface. Since the board preferably has a reasonable amount of rigidity, materials that can be used include silicon, sapphire, GaAs, or another semiconductor wafer material; or metal, quartz, glass, ceramic, printed board, or the like. In the present invention, the support board may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer.

Next, the insulation layer 11a is formed so that the portions in which the second electrodes 15 are formed are opened. When the support board 25 is configured with an electroconductive film formed thereon, the insulation layer 11a is disposed on the electroconductive film. The insulation layer 11a is formed from a photosensitive organic material in which, e.g., diazonaphthoquinone (DNQ), which has high via resolution, is used as a photosensitizer. Examples of the organic material that may be used include materials based on epoxy, epoxy acrylate, urethane acrylate, polyester, phenol, polyimide, BCB (benzocyclobutene), PBO (polybenzoxazole), polynorbornene, and the like. Polyimide-based materials and PBO-based materials in particular have good membrane strength, tensile modulus of elasticity, elongation at break, and other mechanical characteristics, and high reliability can therefore be achieved. Making the surface of the insulation layers 11 smooth without roughening the surface is advantageous for achieving excellent transmission characteristics. In the present invention, photosensitive polyimide is formed to a thickness of 10 µm, and the surface is not roughened. In order to achieve excellent transmission characteristics, the surface of the insulation layer 11a is preferably smoothed without roughening. When a photosensitive organic material is used, the openings of the insulation layer 11a for the portions in which the second electrodes 15 are formed can be formed by photolithography. When a photosensitive organic material having a low pattern resolution is used, the openings formed in the insulation layer 11a can be formed by laser machining, dry etching, or blasting. The second electrodes 15 are formed in the openings of the insulation layer 11a thus formed. The second electrodes 15 are formed from one or a plurality of metal layers. The metal layers thus formed are principally formed from copper, nickel, gold, silver, or another material; or from an alloy. The second electrodes 15 are formed using electrolytic plating, electroless plating, printing, vapor deposition, or another method using the insulation layer 11a are a mask. FIG. 4A shows the state in which the second electrodes 15 are formed to the same thickness as that of the insulation layer 11a, but the thickness of the second electrodes 15 may be less than the thickness of the insulation layer 11a.

After the second electrodes 15 have been formed on the support board 25, the insulation layer 11 is formed so as to cover the second electrodes 15, and the surface of the second electrodes 15 on the side opposite the surface in contact with the support board 25 is exposed by wet etching, dry etching, blasting, cutting, CMP, laser machining, buff polishing, belt sanding, or another method.

In the present embodiment, photolithography is used because the photosensitive polyimide resin is formed to a thickness of 7 μm. Also, in the present embodiment, copper is layered to a thickness of 2 μm and nickel to a thickness of 3 μm in order from the support board 25 by feeding power from a seed metal layer (not shown) formed on the support board 25.

Next, the second wiring layer 13 is formed on the second electrodes 15 and insulation layer 11a. The principal material of the second wiring layer 13 is preferably composed of one or more metals selected from copper, gold, nickel, aluminum, silver, and palladium, but copper is most advantageous from the aspect of cost and resistance. Also, nickel can prevent an interface reaction with the insulation material or another material, and can be used as resistance wiring or as an inductor in which the magnetic characteristics are utilized. The second wiring layer 13 does not have an adhesive layer that is typified by chromium, titanium, tungsten, molybdenum, tantalum, vanadium, nickel, or another material designed to assure adhesion to the insulation layer 11a. When nickel is used as the principal material of the second wiring layer 13, wiring is composed of a plurality of metal films comprising copper and nickel layered on the insulation layer 11a.

The second wiring layer 13 is formed from copper, as described above, and the thickness is 10 μm, for example. Examples of the method for forming the second wiring layer 13 include the subtractive, semi-additive, and fully additive methods. The subtractive method is a method in which a resist of a desired pattern is formed on a copper foil disposed on a board, the unneeded copper foil is etched away, and the resist is thereafter peeled away to obtain the desired pattern. The semi-additive method is a method in which a power supply layer is formed by electroless plating, sputtering, CVD (Chemical Vapor Deposition), or another method; a resist having a desired pattern is then formed; a metal is deposited by electrolytic plating in the resist openings; the resist is removed; and the power supply layer is then etched to obtain the desired wiring pattern. The fully additive method is a method in which an electroless plating catalyst is adsorbed onto a board, a resist pattern is then formed, the catalyst is activated while the resist is left behind as an insulation layer, and a metal is deposited in the openings in the insulating film by electroless plating to obtain a desired wiring pattern. Also, a method may be used in which concavities that form the wiring pattern are formed in the insulation layer 11c (see FIG. 4E) on which the first wiring layer 12 is disposed; a power supply layer is formed by electroless plating, sputtering, CVD, or another method; the concavities are then filled using electroless plating or electrolytic plating; and the surface is smoothed by polishing. In the present embodiment, the semi-additive method is used in which a copper-sputtered film is used as the power supply layer.

Figure 4B:
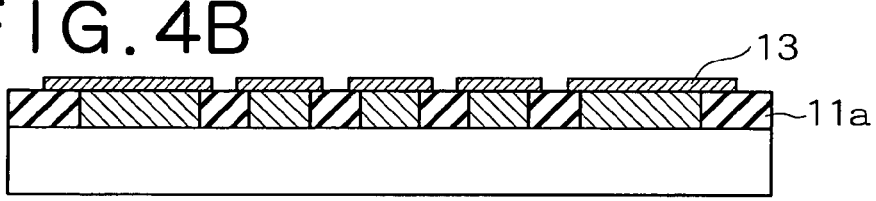
Figure 4C:
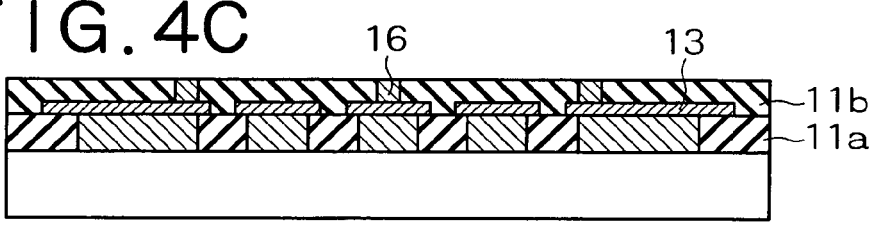

Next, the insulation layer 11b is formed so as to cover the second wiring layer 13, and vias 16 for forming electrical connections are formed in the insulation layer 11b, as shown in FIG. 4C. The insulation layer 11b is formed from a photosensitive organic material in which, e.g., diazonaphthoquinone (DNQ), which has high via resolution, is used as a photosensitizer. Examples of the organic material that may be used include materials based on epoxy, epoxy acrylate, urethane acrylate, polyester, phenol, polyimide, BCB (benzocyclobutene), PBO (polybenzoxazole), polynorbornene, and the like. Polyimide-based materials and PBO-based materials in particular have good membrane strength, tensile modulus of elasticity, elongation at break, and other mechanical characteristics, and high reliability can therefore be achieved. Making the surface of the insulation layer 11b smooth without roughening the surface is advantageous for achieving excellent transmission characteristics. When a photosensitive organic material is used, the openings of the insulation layer 11a in which the second electrodes 15 are formed are formed by photolithography. When a photosensitive organic material having a low pattern resolution is used, the openings formed in the insulation layer 11a can be formed by laser machining, dry etching, or blasting. Also, there is no need to form openings in the insulation layer 11a in advance by a method in which an insulating film is formed after plating posts are formed in advance in the positions of the vias 16, and the surface of the insulating film is ground off to expose the plated posts and to form vias 16. In the present embodiment, photolithography is adopted because a photosensitive polyimide resin having a thickness of 8 μm is used.

Figure 4D:
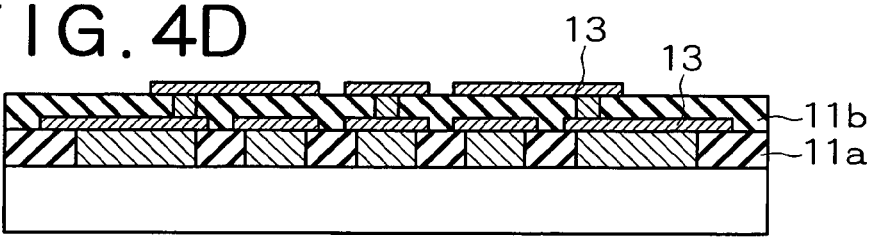

Next, the second wiring layer 13 is formed on the insulation layer 11b in the same manner as FIG. 4B, as shown in FIG. 4D.

Figure 4E:
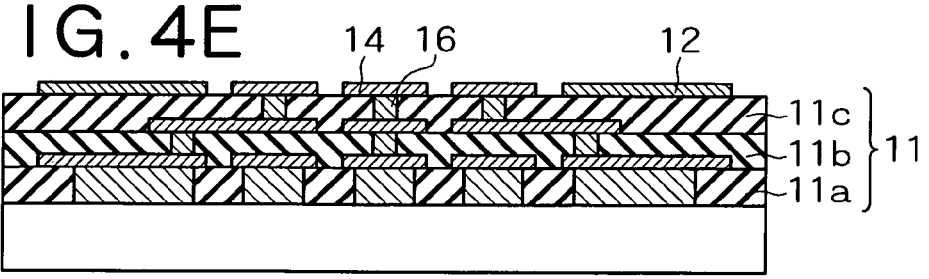

The insulation layer 11c and vias 16 are formed and the first electrodes 14 are formed on the insulation layer 11c in the same manner as FIG. 4C, as shown in FIG. 4E. In FIG. 4E, the first electrodes 14 are formed on the vias 16, but no limitation is imposed by this configuration, and the first electrodes 14 may be formed on the insulation layer 11a. Also, the first wiring layer 12 may be formed on the surface on which the first electrodes 14 are formed. In this case, the first electrodes 14 and first wiring layer 12 may be formed in separate steps, or may be formed in the same step by patterning the same electroconductive film.

The first electrodes 14 are disposed on the insulation layer 11c or the vias 16, and are electrically connected to the second electrodes 15 by way of the vias 16, first wiring layer 12, and second wiring layer 13. The first electrodes 14 are formed by laminating a plurality of layers, for example, and the surface of the first electrodes 14 is preferably formed from at least one metal or an alloy selected from the group consisting of gold, silver, copper, tin, and solder materials, with consideration given to the connectivity of the bonding wire or the wettability of solder balls formed on the surface of the first electrodes 14, for example. The first electrodes 14 are formed by the subtractive, fully additive, or semi-additive method, in the same manner as the second wiring layer 13. Although not depicted, it is possible to add a solder resist in a pattern having openings on the inner side of the first electrodes 14, or in a pattern having openings that do not make contact with the first electrodes 14. The structure may furthermore be one in which a solder resist pattern is formed and the pattern of the first electrodes 14 is then disposed so as to cover the openings. In the present invention, the first electrodes can be formed by sequentially layering copper to a thickness of 5 μm, nickel to a thickness of 3 μm, and gold to a thickness of 0.5 μm, wherein gold is the topmost layer.

Figure 4F:
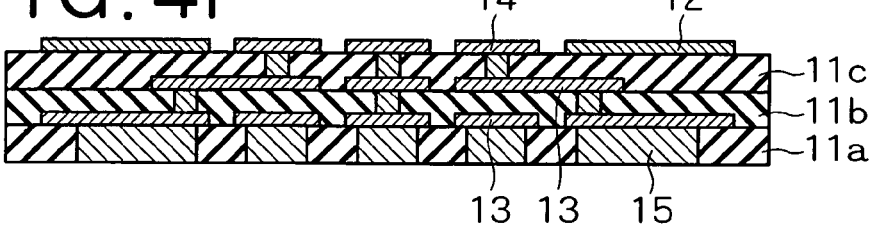

Next, the support board 25 is removed as shown in FIG. 4F. Methods for removing the support board 25 include grinding, chemical and mechanical polishing, etching, or another method. These methods may be combined, and after the support board 25 has been ground off, the remaining portion may be removed by chemical and mechanical polishing and/or etching. Etching may be dry etching or wet etching, but when the final removal step is dry etching, the seed metal layer can be stably left behind because the etching selection ratio can be set to a high value. Removal of the support board 25 can furthermore be facilitated if a release layer is disposed between the support board 25 and the seed metal layer. If a thermally decomposing material is used as the release layer, the seed metal layer and the support board 25 can be separated by heating the layer to the thermal decomposition temperature or higher in the step for removing the support board 25. In this case, heating is preferably carried out using a laser or another method for providing localized heating. The release layer alone can be locally heated by setting the wavelength of the laser to a level at which the light passes through the support board 25 but does not pass through the release layer. Apart from this method, it is also possible to select in advance a material whose adhesive strength weakens at the boundary between the support board 25 and the release layer or at the boundary between the release layer and the seed metal layer, and to apply mechanical force to peel away the support board 25 in the step for removing the support board 25. By selecting as the release layer a material that dissolves in a specific solution or a material whose adhesion to the seed metal layer or the support board 25 is dramatically reduced when permeated by a solution, it is possible to allow a solution to permeate the material via the surface facing the release layer and to then peel away the support board 25. In the present embodiment, a release layer (not shown) that has low adhesion and is formed between the silicon and seed metal layers (not shown) is used, for example, and after the release layer has been peeled away, the seed metal layer (not shown) can be removed by etching.

Specific multilayered wiring boards can be efficiently fabricated by adopting the present embodiment. Also, the example in the present embodiment shows three insulation layers 11 and two wiring layers 12, but no limitation is imposed by this configuration, an a required number of layers 12 may be formed by using the same steps.

(Method for Manufacturing a Semiconductor Device)

Described next is the method for manufacturing a semiconductor device according to the fifth embodiment of the present invention. FIGS. 5A to 5D are local sectional views showing, as a sequence of steps, the method for manufacturing a semiconductor device according to the present embodiment. The manufacturing method of the present embodiment is used for manufacturing the semiconductor device of the second embodiment shown in FIG. 2.

Figure 5A:
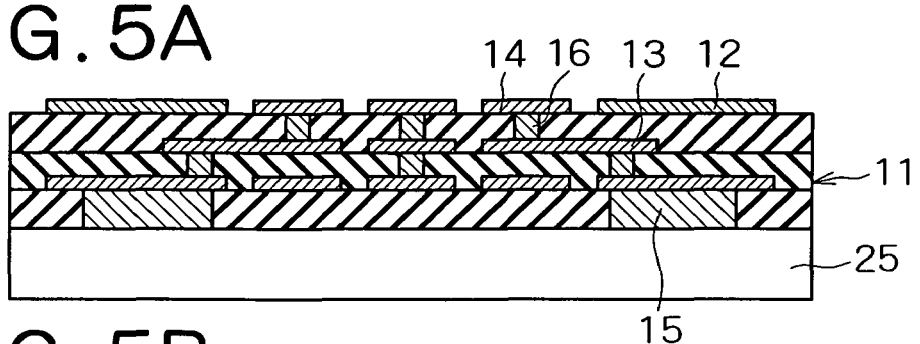
FIG. 5 is a local sectional view showing, as a sequence of steps, the method for manufacturing a semiconductor device according to the fifth embodiment of the present invention.

First, a multilayered wiring board is formed on the support board 25, as shown in FIG. 5A. Therefore, FIGS. 5A and 4E are substantially the same, and the steps up to manufacturing the multilayered wiring board shown in FIG. 5A are the same as those shown in FIGS. 4A to 4D. Washing and heating treatments are suitably carried out between each step.

In the present embodiment, an insulation layer 11a is provided by forming a photosensitive polyimide resin to a thickness of 7 μm on a support board 25 in which a release layer (not shown) and an electroconductive seed metal layer (not shown) are sequentially disposed on a silicon wafer that has a thickness of 0.725 mm and a diameter of 8 inches (200 mm) and that is provided with a thermal oxidation layer, for example. The second electrodes 15 are formed by layering copper to a thickness of 2 μm and nickel to a thickness of 3 μm in order from the support board 25 by feeding power from the seed metal layer (not shown) formed on the support board 25. Formed by the semi-additive method are a second wiring layer 13 using copper to a thickness of 10 μm; a first wiring layer 12 using copper to a thickness of 5 μm; and first electrodes 14 composed of a laminate having a layer of copper formed to a thickness of 5 μm, nickel to a thickness of 3 μm, and gold to a thickness of 0.5 μm, wherein gold is the topmost layer. FIG. 5 shows a structure in which a first wiring layer 12 is provided, but the first wiring layer 12 is optional and is not required to be formed.

Figure 5B:
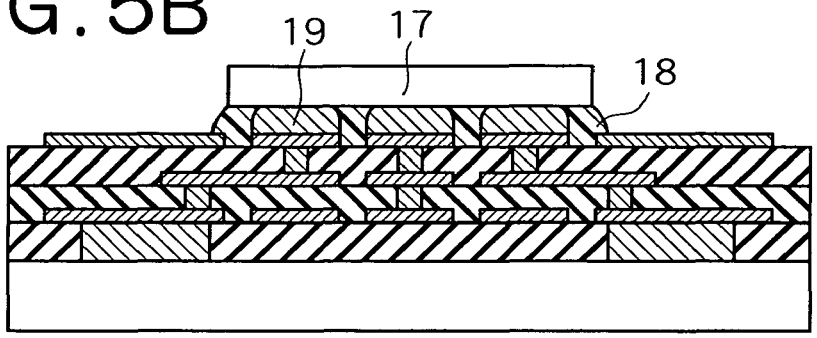

Next, the electrodes (not shown) of the semiconductor element 17 are flip-chip connected to the first electrodes 14 by way of solder balls 19, as shown in FIG. 5B. An underfill resin 18 is thereafter filled into the space between the semiconductor element 17 and the multilayered wiring board on which the solder balls 19 are formed. The underfill resin 18 is used for the purpose of reducing the difference in the coefficient of thermal expansion between the semiconductor element 17 and the multilayered wiring board and preventing the solder balls 19 from breaking. An underfill resin 18 is not required to be filled as long as the solder balls 19 have sufficient strength to ensure the desired reliability. The solder balls 19 are microballs composed of solder material, and are formed by plating, ball transfer, or printing on the electrodes of the semiconductor element 17. The material of the solder balls 19 may be suitably selected from a lead-tin eutectic solder or a lead-free solder material. The underfill resin 18 is composed of an epoxy-based material and is filled after the semiconductor element 17 has been connected using the solder balls 19. A frame in which the area of the semiconductor element 17 is opened may be separately attached when the rigidity of the wiring board is insufficient in areas in which the semiconductor element 17 is not mounted. In FIG. 5, the semiconductor element 17 is mounted using a flip-chip connection, but the semiconductor element may be mounted using wire bonding.

Figure 5C:
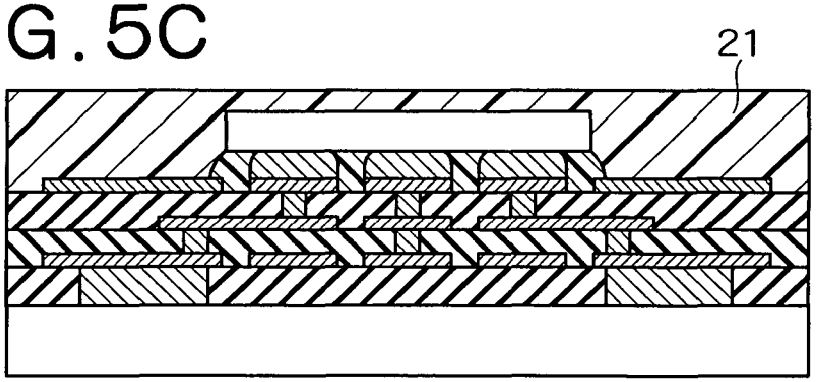

Next, a sealing resin 21 is formed so as to cover the semiconductor element 17, as shown in FIG. 5C. The sealing resin 21 comprises a material obtained by adding a silica filler to an epoxy-based material, and is applied using the printing method, compression molding, or transfer molding in which a metal mold is used, so as to cover the mounted semiconductor element 17 and the wiring of the connecting portions of the element. The diagram in FIG. 5C shows a structure in which the sealing resin 21 covers the entire surface on one side of the wiring board, but the structure may be one in which the semiconductor element 17 is partially covered and a part of the wiring board is exposed. Also, a sealing resin 21 is not required to be formed if there is no problem in the rigidity of the multilayered wiring board and in protecting the semiconductor element 17.

Next, the support board 25 is removed using the method described above, as shown in FIG. 5D. The solder balls 20 are subsequently attached to the second electrodes 15. The solder balls 20 are attached in order for the semiconductor device of the present invention to be mounted on another wiring board.

Figure 5D:
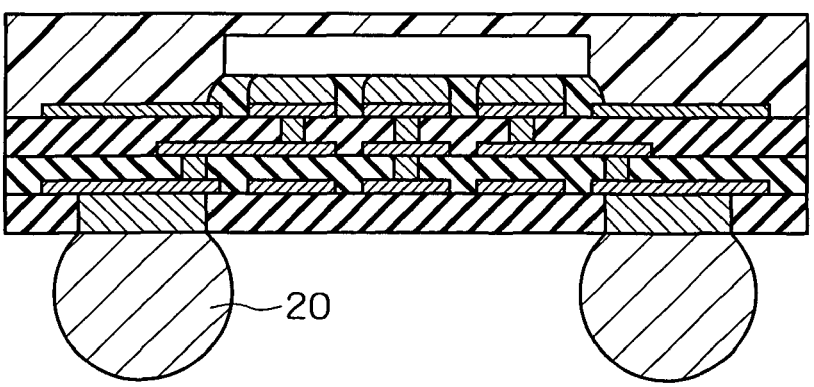

The solder balls 20 are balls composed of solder material and are formed by ball transfer or printing on the second electrodes 15. Depending on the mode of attachment, metal pins may be soldered without attaching the solder balls 20. In FIG. 5D, the solder balls 20 are formed on the second electrodes 15, but the solder balls 20 may be formed on the first electrodes 14, and, if required, may be formed on both the first electrodes 14 and the second electrodes 15. In accordance with the present embodiment, the semiconductor device of the first embodiment can be efficiently manufactured.

FIGS. 6A to 6D are local sectional views showing, as a sequence of steps, the method for manufacturing a semiconductor device according to the sixth embodiment of the present invention. The manufacturing method of the present embodiment is used for manufacturing the semiconductor device of the third embodiment shown in FIG. 3.

Figure 6A:
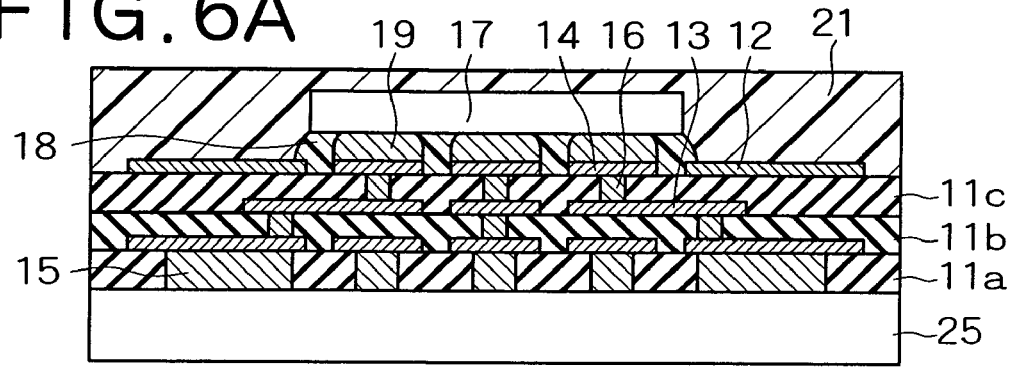
FIG. 6 is a local sectional view showing, as a sequence of steps, the method for manufacturing a semiconductor device according to the sixth embodiment of the present invention.
Figure 6B:
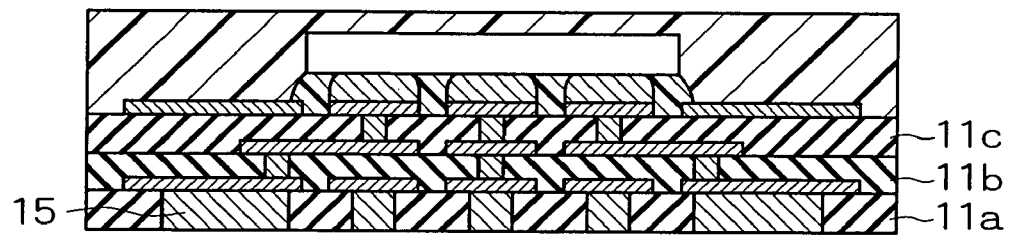
Figure 6C:
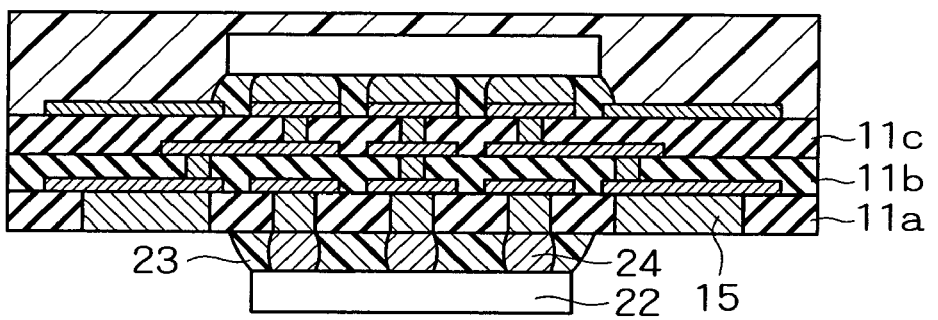

FIG. 6A corresponds to the step shown in FIG. 5C in the method for manufacturing a semiconductor device of the fifth embodiment, and shows the step prior to removing the support board 25. The steps preceding the step shown in FIG. 5C are the same as the steps shown in FIGS. 4 and 5. Washing and heating treatments are suitably carried out between each step.

First, the second electrodes 15, insulation layer 11, first wiring layer 12, second wiring layer 13, and first electrodes 14 are formed on the support board 25, as shown in FIG. 6A. In the present invention, an insulation layer 11a is provided by forming a photosensitive polyimide resin to a thickness of 7 μm on a support board 25 in which a release layer (not shown) and an electroconductive seed metal layer (not shown) are sequentially disposed on a silicon wafer that has a thickness of 0.725 mm and a diameter of 8 inches (200 mm) and that is provided with a thermal oxidation layer. The second electrodes 15 are formed by layering copper to a thickness of 2 μm and nickel to a thickness of 3 μm in order from the support board 25 by feeding power from the seed metal layer (not shown) formed on the support board 25. Formed by the semi-additive method are a second wiring layer 13 using copper to a thickness of 10 μm; a first wiring layer 12 using copper to a thickness of 5 μm; and first electrodes 14 composed of a laminate having a layer of copper formed to a thickness of 5 μm, nickel to a thickness of 3 μm, and gold to a thickness of 0.5 μm, wherein gold is the topmost layer. FIG. 6A shows a structure in which a first wiring layer 12 is provided, but the first wiring layer 12 is optional and is not required to be formed. The semiconductor element 17 is flip-chip connected to the first electrodes 14 by way of the solder balls 19, an underfill resin 18 is filled, and the structure is covered using a sealing resin 21. In the same manner as in the method for manufacturing the preceding semiconductor device, an underfill resin 18 is not required to be filled as long as the solder ball 18 has sufficient strength to ensure the desired reliability. A frame in which the area of the semiconductor element 17 is opened may be separately attached when the rigidity of the multilayered wiring board is insufficient in areas in which the semiconductor element 17 is not mounted. Also, a sealing resin 21 is not required to be formed if there is no problem in the rigidity of the multilayered wiring board and in protecting the semiconductor element 17. In FIG. 6, the semiconductor element 17 is mounted using a flip-chip connection, but the semiconductor element may be mounted by wire bonding.

Next, the support board 25 is removed using the method described above, as shown in FIG. 6B.

Next, the electrodes (not shown) of the semiconductor element 22 are flip-chip connected to the exposed second electrodes 15 by way of solder balls 24, as shown in FIG. 5C. An underfill resin 23 is thereafter filled into the space between the semiconductor element 22 and the multilayered wiring board on which the solder balls 24 are formed. The underfill resin 23 is used for the purpose of reducing the difference in the coefficient of thermal expansion between the semiconductor element 22 and the multilayered wiring board and preventing the solder balls 24 from breaking. An underfill resin 23 is not required to be filled as long as the solder balls 24 have sufficient strength to ensure the desired reliability. The solder balls 24 are micro-balls composed of solder material, and are formed by plating, ball transfer, or printing on the electrodes of the semiconductor element 22. The material of the solder balls 24 may be suitably selected from a lead-tin eutectic solder or a lead-free solder material. The underfill resin 23 is composed of an epoxy-based material and is filled after the semiconductor element 22 has been connected using the solder balls 24. A frame in which the area of the semiconductor element 22 is opened may be separately attached when the rigidity of the wiring board is insufficient in areas in which the semiconductor element 22 is not mounted. In FIG. 6, the semiconductor element 22 is mounted using a flip-chip connection, but the semiconductor element may be mounted using wire bonding.

Figure 6D:
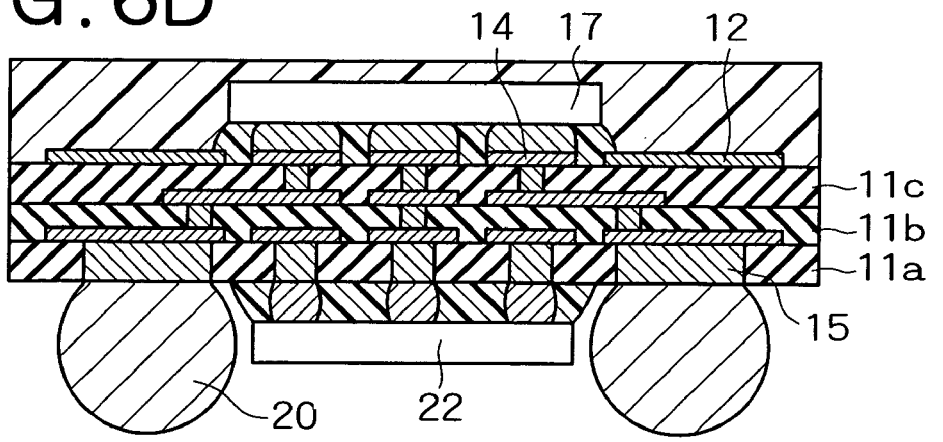

The solder balls 20 are subsequently attached to the second electrodes 15, as shown in FIG. 6D. The solder balls 20 are attached in order for the semiconductor device of the present invention to be mounted on another wiring board. The solder balls 20 are balls composed of solder material and are formed by ball transfer or printing on the second electrodes 15. Depending on the mode of attachment, metal pins may be soldered without attaching the solder balls 20. In FIG. 6D, the solder balls 20 are formed on the second electrodes 15, but the solder balls 20 may be formed on the first electrodes 14, and, if required, may be formed on both the first electrodes 14 and the second electrodes 15. In accordance with the present embodiment, the semiconductor device of the second embodiment can be efficiently manufactured.

What is claimed is:

1. A multilayered wiring board comprising:
    first and second electrodes disposed on a first surface and a second surface, respectively, of said multilayered wiring board;
    a plurality of insulation layers;
    a plurality of wiring layers disposed between said insulation layers; and
    vias that are disposed in an insulation layer and electrically connect the overlying wiring layer and the underlying wiring layer that sandwich the insulation layer, wherein
    said second electrode is embedded in the insulation layer exposed on said second surface,
    the wiring layer covered by the insulation layer exposed on said second surface does not have an adhesive layer that faces the insulation layer exposed on said second surface, and
    said first and second electrodes are exposed externally on said multilayered wiring board,
    wherein said second electrode and the wiring layer covered by the insulation layer exposed on said second surface are in direct contact, and
    wherein a top surface of said second electrode exposed externally on said multilayered wiring board is not covered with any insulation layers, and said second electrode and a conductive bump are in direct contact.

2. The multilayered wiring board according to claim 1, wherein the material of said insulation layer is a photosensitive resin in which diazonaphthoquinone is used as a photosensitizer.

3. A semiconductor device comprising one or a plurality of semiconductor elements mounted on one or both of said first electrode and said second electrode of the multilayered wiring board according to claim 1.

4. The multilayered wiring board according to claim 1, wherein an underfill resin is filled in the space between a semiconductor element and said multilayered wiring board.

5. The multilayered wiring board according to claim 1, wherein the first electrode and an adhesive layer including a metal are disposed on a surface of at least one of plurality of said insulation layers.

6. The multilayered wiring board according to claim 5, wherein the material of said adhesive layer is a metal whose main component is selected from chromium, titanium, tungsten, molybdenum, tantalum, vanadium, nickel, or the like, an alloy of two or more of the metals, or a compound containing one or more of the metals.

7. The multilayered wiring board according to claim 1, wherein the insulation layer exposed to said second surface is not attached to an exposed surface of said second electrode.

8. The multilayered wiring board according to claim 1, wherein said plurality of wiring layers extend in a plane parallel to said plurality of insulation layers and said vias extend in a plane orthogonal to said plurality of insulation layers.

9. A multilayered wiring board comprising:
a topmost first insulation layer;
a bottommost second insulation layer;
one or a plurality of intermediate insulation layers disposed between said topmost first insulation layer and said bottommost second insulation layer;
a wiring layer disposed between said topmost first insulation layer and said intermediate insulation layer, between said intermediate insulation layers, and between said intermediate layers and said bottommost second insulation layer;
vias that are disposed in said topmost first insulation layer, said intermediate insulation layer, or said bottommost second insulation layer, and that electrically connect a lower wiring layer and an upper wiring layer on the insulation layer;
a first electrode formed on an outer surface of said topmost first insulation layer; and
a second electrode exposed on an outer surface of said bottommost second insulation layer and embedded in said bottommost second insulation layer, wherein
the wiring layer covered by said bottommost second insulation layer does not have an adhesive layer that faces the bottommost second insulation layer, and
wherein said second electrode and the wiring layer covered by said bottommost second insulation layer are in direct contact, and
wherein a top surface of the second electrode exposed on the outer surface of said bottommost second insulation layer is not covered with any insulation layers.

10. The multilayered wiring board according to claim 9, wherein the material of said topmost first insulation layer, said bottommost insulation layer, and said plurality of intermediate insulation layers is a photosensitive resin in which diazonaphthoquinone is used as a photosensitizer.

11. A semiconductor device comprising one or a plurality of semiconductor elements mounted on one or both of said first electrode formed on the outer surface of said topmost first insulation layer and said second electrode exposed on the outer surface of said bottommost second insulation layer of the multilayered wiring board according to claim 9.

12. The multilayered wiring board according to claim 9, wherein an underfill resin is filled in the space between a semiconductor element and said multilayered wiring board.

13. The multilayered wiring board according to claim 9, wherein the first electrode and an adhesive layer including a metal are disposed on a surface of said topmost insulation layer.

14. The multilayered wiring board according to claim 13, wherein the material of said adhesive layer is a metal whose main component is selected from chromium, titanium, tungsten, molybdenum, tantalum, vanadium, nickel, or the like, an alloy of two or more the metals, or a compound containing one or more of the metals.

15. The multilayered wiring board according to claim 9, wherein said bottommost second insulation layer is not attached to an exposed surface of said second electrode.

* * * * *